United States Patent [19]
Wong et al.

[11] Patent Number: 5,731,239
[45] Date of Patent: Mar. 24, 1998

[54] METHOD OF MAKING SELF-ALIGNED SILICIDE NARROW GATE ELECTRODES FOR FIELD EFFECT TRANSISTORS HAVING LOW SHEET RESISTANCE

[75] Inventors: Harianto Wong; Kin Leong Pey, both of Singapore, Singapore; Lap Chan, San Francisco, Calif.

[73] Assignee: Chartered Semiconductor Manufacturing PTE Ltd., Singapore, Singapore

[21] Appl. No.: 787,193

[22] Filed: Jan. 22, 1997

[51] Int. Cl.$^6$ ................................. H01L 21/336
[52] U.S. Cl. .................. 438/296; 438/532; 438/533; 438/586
[58] Field of Search ....................... 438/296, 532, 438/533, 586

[56] References Cited

U.S. PATENT DOCUMENTS

| | | | |
|---|---|---|---|
| 5,334,545 | 8/1994 | Caviglia | 437/41 |
| 5,447,874 | 9/1995 | Grivna et al. | 437/40 |
| 5,494,857 | 2/1996 | Cooperman et al. | 437/228 |

OTHER PUBLICATIONS

J.A. Kittl et al. "A Ti Salicide Process for 0.01 μm Gate Length CMOS Technology". Published in 1986 Symposium of VLSI Technology Digest of Technical Papers, pp. 14–15.

*Primary Examiner*—John Niebling
*Assistant Examiner*—Brendan Mee
*Attorney, Agent, or Firm*—George O. Saile; Stephen B. Ackerman

[57] ABSTRACT

A method for making low sheet resistance sub-quarter-micrometer gate electrode lengths on field effect transistors has been achieved. The method involves patterning gate electrodes on a silicon substrate from a conductively doped polysilicon layer having a silicon nitride layer on the surface. After forming the FET lightly doped drains (LDD), the sidewall spacers, and the heavily doped source/drain contact regions with titanium contacts, an insulating layer is chemically/mechanically polished back to the silicon nitride or silicon oxynitride on the gate electrode layer to form a planar self-aligning mask. A pre-amorphizing implantation is carried out, and a titanium silicide is selectively formed on the gate electrodes resulting in small grain sizes and much reduced sheet resistance. The self-aligned mask prevents ion implant damage to the shallow source/drain regions adjacent to the FET gate electrodes. A second embodiment uses the self-aligned mask to form selectively a cobalt silicide on the polysilicon gate electrodes for low sheet resistance, while preventing the cobalt silicide from reacting with the adjacent titanium silicide source/drain regions.

19 Claims, 5 Drawing Sheets

5,731,239

1

METHOD OF MAKING SELF-ALIGNED SILICIDE NARROW GATE ELECTRODES FOR FIELD EFFECT TRANSISTORS HAVING LOW SHEET RESISTANCE

BACKGROUND OF THE INVENTION

1. Field of the Invention

The present invention relates to the fabrication of integrated circuit devices on semiconductor substrates, and more particularly relates to a method for making sub-quarter-micrometer gate electrodes by using a self-aligned mask to selectively amorphize the polysilicon gate electrodes on which is formed a low resistance titanium silicide. A second embodiment uses the self-aligned mask to form a low resistance cobalt silicide on gate electrodes.

2. Description of the Prior Art

Advances in the semiconductor process technologies in recent years have dramatically decreased the device feature size and increased the circuit density and performance on integrated circuit chips. The field effect transistor (FET) is used extensively for Ultra Large Scale Integration (ULSI). These FETs are formed using polysilicon gate electrodes and self-aligned source/drain contact areas.

The conventional FETs are typically fabricated by patterning polysilicon gate electrodes over a thin gate oxide on a single crystal semiconductor substrate. The gate electrode structure is used as a diffusion or implant barrier mask to form self-aligned source/drain areas in the substrate adjacent to the sides of the gate electrode. The distance from the source junction to drain junction under the gate electrode is defined as the channel length of the FET.

Advances in semiconductor technologies, such as high resolution photolithographic techniques and anisotropic plasma etching, to name a few, have reduced the minimum feature sizes on devices to less than a quarter-micrometer. For example, FETs having gate electrodes with widths less than 0.35 micrometers (um), and channel lengths that are less than the gate electrode width are currently used in the industry.

However, as this downscaling continues and the channel length is further reduced, the FET device experiences a number of undesirable electrical characteristics. One problem associated with these narrow gate electrodes is the high electrical sheet resistance which impairs the performance of the integrated circuit.

One method of circumventing this problem is to form on the gate electrode a metal silicide layer that substantially reduces the sheet resistance of the polysilicon gate electrode, and also the local electrical interconnecting lines made from the same polysilicon layer. A typical approach is to use a salicide process. In this process the polysilicon gate electrodes are patterned over the device areas on the substrate. Insulating sidewall spacers are formed on the sidewalls of the gate electrodes, and source/drain areas are implanted adjacent to the gate electrodes. Using the salicide process, a metal is deposited over the polysilicon gate electrodes and the self-aligned source/drain areas, and sintered to form a silicide layer on the polysilicon gates and silicide contacts in the source/drain areas. The unreacted metal on the insulating layer is selectively removed. Unfortunately, the formation of these salicide gate electrodes can result in undesirable effects, such as residual metal or silicide stringers extending over the narrow spacers causing electrical shorts between the gate electrodes and the source/drain areas.

A second problem results from forming titanium silicide on sub-quarter-micrometer FETs. The problem is that it is

2 difficult to form low sheet resistance silicide on these sub-0.25-micrometer (um) gate lengths. One method to circumvent this problem is to use a cobalt or a nickel silicide to replace the titanium silicide. An alternative method to improve the sheet resistance is to amorphize the polysilicon layer by ion implantation prior to forming the titanium silicide, as detailed in "A Ti Salicide Process for 0.10 um Gate Length CMOS Technology," by J. A. Kittl et al., published in 1996 Symposium of VLSI Technology Digest of Technical Papers, pages 14-15.

Still another problem arises if the polysilicon is amorphized by ion implantation using the salicide process. The implantation that occurs in the source/drain areas can result in crystalline damage, which can adversely affect the electrical characteristics of the device, and is not easily annealed out. Therefore it would be desirable to have a process that avoids this implant in the source/drain areas.

Another related reference is by A. L. Caviglia, U.S. Pat. No. 5,334,545 in which a cobalt silicide T-gate structure is formed on a silicon substrate which allows for forming self-aligning source/drain regions while providing lower gate resistance and lower parasitic capacitance. The disadvantage of this process is that the source/drain implants are formed after the silicide and therefore limits the annealing cycle for removing the crystalline damage. Another related patent is U.S. Pat. No. 5,447,874 by G. Grivna et al. in which a chemical/mechanical polishing is used to make a dual-metal gate. The chemical/mechanical polishing is used to polish back a gate metal layer over a trench in an insulating layer thereby providing a metal gate in the trench area. The metal gate electrode circumvents the use of the more conventional polysilicon gate electrode having a silicide, but in general appears to require additional processing steps.

A final related reference is U.S. Pat. No. 5,494,857 in which S. S. Coopermann et al. teach a method for making shallow trenches in semiconductor substrates using chemical/mechanical polishing. Coopermann et al. do not address the formation of improved low sheet resistance gate electrodes for FETs.

Therefore, there is still a strong need in the semiconductor industry for making sub-quarter-micrometer gate electrodes having lower sheet resistance using improved silicide techniques, and for controlling manufacturing costs by reducing the number of photoresist masking steps and other processing steps.

SUMMARY OF THE INVENTION

It is therefore a principal object of this invention by a first embodiment to form field effect transistors having sub-quarter-micrometer wide gate electrodes with reduced sheet resistance.

It is another object of this invention to provide these low sheet resistance gate electrodes using a pre-amorphization implantation while avoiding implant damage in the source/drain areas.

A further object of this invention by a second embodiment is to form field effect transistors having low sheet resistance gate electrodes using silicide cobalt.

It is still another object of the invention to reduce the number of photoresist masking steps and to simplify the process to provide a cost-effective manufacturing process.

In accordance with the objects of the embodiments, a method for fabricating improved field effect transistors (FETs) having deep sub-micrometer polysilicon lines used for FET gate electrodes and electrical interconnections with improved low sheet resistance is described. In a first embodiment the low sheet resistance is achieved by using a pre-amorphization implantation of the polysilicon gate electrodes on which are formed a titanium silicide. In a second embodiment a cobalt silicide on the polysilicon gate electrodes is used to reduce sheet resistance.

The method begins by providing a single crystal semiconductor substrate, such as a single crystal silicon doped with a P-type dopant, such as boron. Shallow trench isolation regions planar with the surface of the substrate are formed that surround and electrically isolate device areas. Thermal oxidation is used to form a thin gate oxide on the device areas for the FETs. A polysilicon layer is deposited on the substrate using low pressure chemical vapor deposition (LPCVD), and doped with an $N^+$ conductive dopant, for example, by implanting arsenic ($As^{75}$) ions. A silicon nitride layer is deposited on the polysilicon layer, for example, by LPCVD. The silicon nitride layer and the polysilicon layer are then patterned by photoresist masking and anisotropic etching to form gate electrodes on the device areas and to form electrically interconnecting lines over the shallow trench isolation regions. A thin insulating layer and lightly doped source/drain regions adjacent to the gate electrodes are formed by implanting ions, such as $As^{75}$. Insulating sidewall spacers are formed on the sidewalls of the gate electrodes by depositing a conformal first insulating layer over the gate electrodes and anisotropically etching back the first insulating layer. Heavily doped source/drain contact areas are formed next by implanting an $N^+$ dopant, such as arsenic, adjacent to the sidewall spacers of the gate electrodes. A blanket first titanium (Ti) layer is deposited and annealed to form titanium silicide on the $N^+$ doped source/drain contact areas. The unreacted titanium on the insulated surfaces of the substrate is then removed in a wet etch of deionized water (DI $H_2O$), 30% hydrogen peroxide ($H_2O_2$), and ammonium hydroxide ($NH_4OH$). A relatively thick blanket second insulating layer (interlevel dielectric (ILD)) is deposited on the substrate and chemical/mechanically polished (CMP) back to the silicon nitride layer on the gate electrodes. The silicon nitride layer serves as a polishing-stop layer. The CMP results in global planarization of the ILD layer. The silicon nitride layer over the gate electrodes is selectively removed by wet etching in a hot phosphoric acid ($H_3PO_4$) exposing the $N^+$ polysilicon gate electrodes. A key feature of this invention is that the source/drain areas are protected by the planar second insulating layer, which also serves as a self-aligned implant mask. The polysilicon gate electrodes are now implanted with ions to amorphize the polycrystalline surface of the gate electrodes. A second Ti layer is deposited and annealed to form titanium silicide on the amorphized polysilicon surfaces of the gate electrodes, while the Ti on the second insulating layer remains unreacted. The unreacted Ti on the second insulating layer is then removed by wet etching thereby completing the FETs. The pre-amorphization implantation (PAI) and rapid thermal annealing to form the titanium silicide result in substantially smaller grain sizes on the polysilicon gate electrodes, which reduces the sheet resistance and improves the circuit performance.

A second embodiment is now described for making the sub-quarter-micrometer (<0.25 um) gate electrodes having also a low sheet resistance ($R_S$). In this alternate process, the process steps are identical to the steps in the first embodiment up to and including the removal of the silicon nitride layer over the gate electrodes by using wet etching. Instead of amorphizing the surface by ion implantation, as in the first embodiment, a cobalt layer is deposited, and rapid thermal annealing is used to provide low sheet resistance. The sheet resistance is much improved over the more conventional method of forming a titanium silicide over non-amorphized implanted polysilicon gate electrodes. The unreacted cobalt on the second insulating layer is removed by wet etching to complete the FETs. The self-aligning mask formed from the second insulating layer prevents the cobalt from reacting with the titanium silicide contacts on the source/drain areas.

BRIEF DESCRIPTION OF THE DRAWINGS

The objects and other advantages of the invention will become more apparent in the preferred embodiments when read in conjunction with the following drawings.

DESCRIPTION OF THE PREFERRED EMBODIMENTS

Now in keeping with the objects of this invention, the method for forming these improved sub-quarter-micrometer gate electrodes with lower sheet resistance is described in detail. The sequence of fabrication steps for the first embodiment is detailed in FIGS. 1 through 7. The method is described for an N-channel FET, but it should be well understood by one skilled in the art that the method can be applied to P-channel FETs by appropriately changing the electrical polarity of the dopant, and both P- and N-channel FETs having these low sheet resistance gate electrodes can be made by providing N-wells in the P-doped substrate and complementary metal oxide semiconductor (CMOS) circuits can be formed therefrom.

Figure 1:
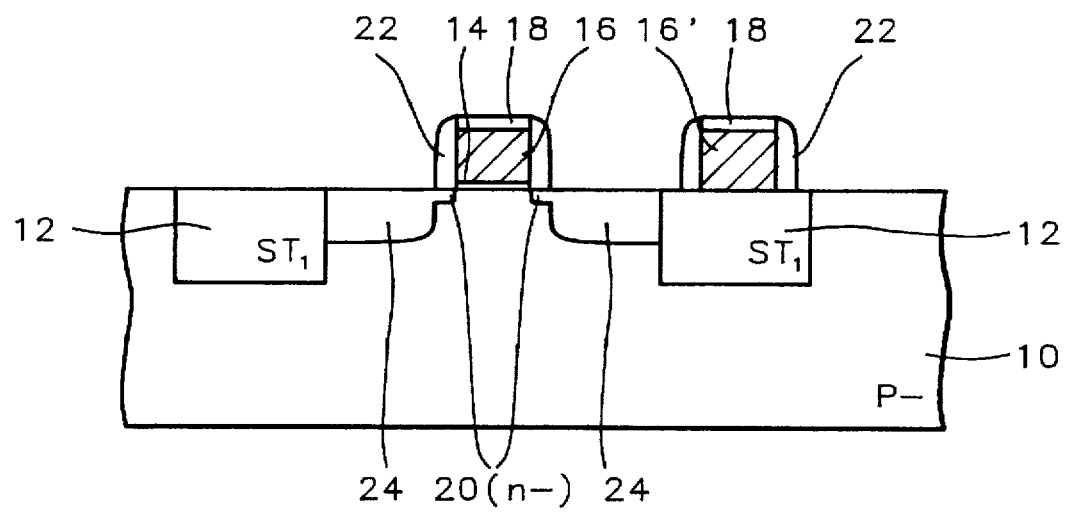
FIGS. 1 through 7 show schematic cross-sectional views of a field effect transistor for the sequence of processing steps for making gate electrodes using a self-aligned implant mask to amorphize the polysilicon gate electrodes and for reducing the titanium silicide sheet resistance.

Referring now to FIG. 1, a cross-sectional view of a substrate 10 having a partially completed field effect transistor formed on and in the substrate surface is schematically shown. The preferred substrate is composed of a P-type single crystal silicon having a <100> crystallographic orientation. Shallow trench isolation regions (STI) 12 are formed to a depth of between about 4000 and 20000 Angstroms around the active device regions to electrically isolate the individual devices. The shallow trench isolation regions can be made using a variety of methods. For example, one method is the Buried OXide (BOX) isolation used for shallow trenches. The method involves filling the trenches with a chemical vapor deposited (CVD) silicon oxide ($SiO_2$) and then etched back or chemical/mechanically polished to yield a planar surface. The shallow trenches etched for the BOX process are anisotropically plasma etched into the silicon substrate and are typically between about 0.5 and 0.8 micrometers (um) deep.

Still referring to FIG. 1, the FETs are now formed in the active device areas by first thermally oxidizing the device regions to form a thin gate oxide 14. The preferred thickness of oxide 14 is between about 30 and 80 Angstroms. Alternatively, when tantalum oxide is used instead of silicon oxide, then the preferred thickness of layer 14 is between about 80 and 120 Angstroms. A polysilicon layer 16 and a silicon nitride ($Si_3N_4$) layer 18 are deposited, and conventional photolithographic techniques and anisotropic plasma etching are used to pattern the $Si_3N_4$ layer 18 and the polysilicon layer 16. This forms the gate electrodes 16 for the FETs in the device regions and electrically conducting interconnecting lines 16' elsewhere on the substrate 10 over the shallow trench isolation regions 12. Polysilicon layer 16 is preferably deposited using low pressure chemical vapor deposition (LPCVD) using, for example, silane ($SiH_4$). The thickness of polysilicon layer 16 is between about 1500 and 3000 Angstroms, and is doped with an $N^+$ conductive dopant, for example, by implanting arsenic ($As^{75}$) ions. Alternatively, layer 16 can be doped in situ by adding a dopant gas such as phosphine ($PH_3$) or arsine ($ASH_3$) during the polysilicon deposition. After doping layer 16 the preferred dopant concentration is between about 1.2 E 20 and 2.8 E 20 atoms/$cm^3$. Silicon nitride or silicon oxynitride layer 18 is deposited on polysilicon layer 16, for example, by LPCVD. The silicon nitride layer is preferably deposited by LPCVD using a reactant gas such as dichlorosilane ($SiCl_2H_2$) and ammonia ($NH_3$), typically in a temperature range of between about 700° and 800° C. Layer 18 is deposited to a preferred thickness of between about 1000 and 2000 Angstroms. Lightly doped source/drain regions 20 are formed adjacent to the gate electrodes 16 by using ion implantation of an N-type dopant species such as arsenic or phosphorus. A typical lightly doped source/drain region can be formed by implanting phosphorus ($P^{31}$) at a dose between about 1.0 E 13 and 1.0 E 14 atoms/$cm^2$ at an energy of between about 30 and 80 KeV.

After forming the lightly doped source/drain regions 20, insulating sidewall spacers 22 are formed on the sidewalls of the gate electrodes 16. These sidewall spacers are formed by depositing a conformal first insulating layer, preferably a low temperature silicon oxide ($SiO_2$) and anisotropically plasma etching back to the surface of the substrate 10. For example, the $SiO_2$ can be a chemical vapor deposition (CVD) using tetraethoxysilane (TEOS) at a temperature in the range of between about 650° and 900° C., and the etch back performed in a low pressure reactive ion etcher. Heavily doped source/drain contact areas 24 are formed next adjacent to the sidewall spacers 22 of the gate electrodes 16 by implanting an $N^+$ dopant, such as arsenic, to complete the source/drain areas. For example, arsenic ions ($As^{75}$) can be implanted at a dose of between about 2.0 E 15 and 1.0 E 16 atoms/$cm^2$ at an ion energy between about 20 and 70 KeV.

Figure 2:
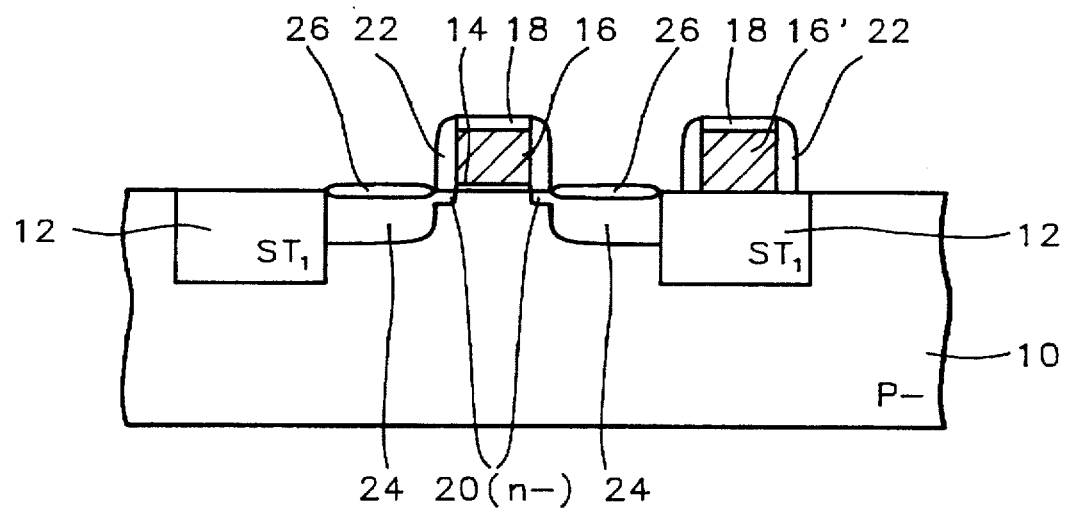

Referring now to FIG. 2, a blanket first titanium (Ti) layer is deposited and annealed to form titanium silicide contacts 26 on the $N^+$ doped source/drain contact areas 24. For example, the Ti layer can be deposited by physical sputtering from a Ti target to a thickness of between about 200 and 450 Angstroms. The Ti is then annealed at a temperature less than 700° C., more specifically at a temperature between about 650° and 700° C. to form the titanium silicide ($TiSi_2$). The unreacted Ti on the insulated surfaces of the substrate is then removed in a wet etch, such as deionized water (DI $H_2O$), 30% hydrogen peroxide ($H_2O_2$), and ammonium hydroxide ($NH_4OH$). A second temperature step of about 850° C. in nitrogen ($N_2$) or argon (Ar) can be carried out to lower the $TiSi_2$ sheet resistance and to complete the $TiSi_2$ phase of the reaction. Preferably the first anneal in $N_2$/Ar is carried out by rapid thermal annealing (RTA) in a temperature range of 600° to 700° C. for a time of between about 20 and 40 seconds, and the second anneal in $N_2$/Ar is carried out at a temperature of between about 800° and 900° C. for between about 20 and 40 seconds.

Referring to FIGS. 3 through 7, the remainder of the first embodiment relates more specifically to the objects of this invention. The method uses a self-aligned mask for carrying out pre-amorphization implantation of the top surface of the polysilicon gate electrodes, while masking from implant damage the source/drain regions. This approach eliminates the requirement of an additional oxide layer and photoresist masking level. The amorphization reduces the sheet resistance on the narrow polysilicon gate electrodes when a $TiSi_2$ layer is formed on the gate electrodes.

Figure 3:
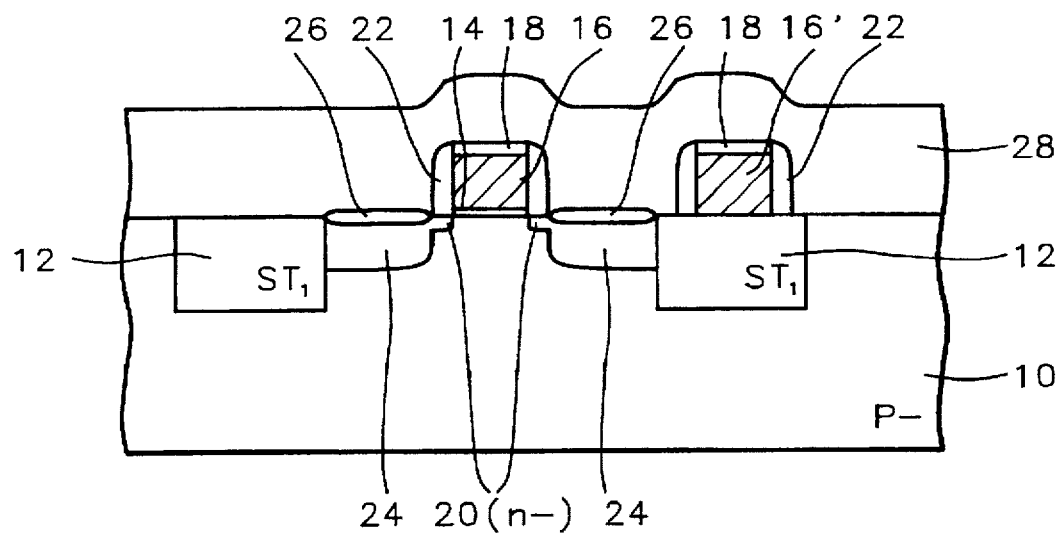

Continuing with the process and referring to FIG. 3, a relatively thick blanket second insulating layer 28, commonly referred to as an interlevel dielectric (ILD), is deposited on the substrate and over the gate electrodes 16. Preferably layer 28 is deposited by LPCVD using a reactant gas such as TEOS to a thickness greater than the height of the gate electrodes, and more specifically between about 10000 and 15000 Angstroms.

Figure 4:
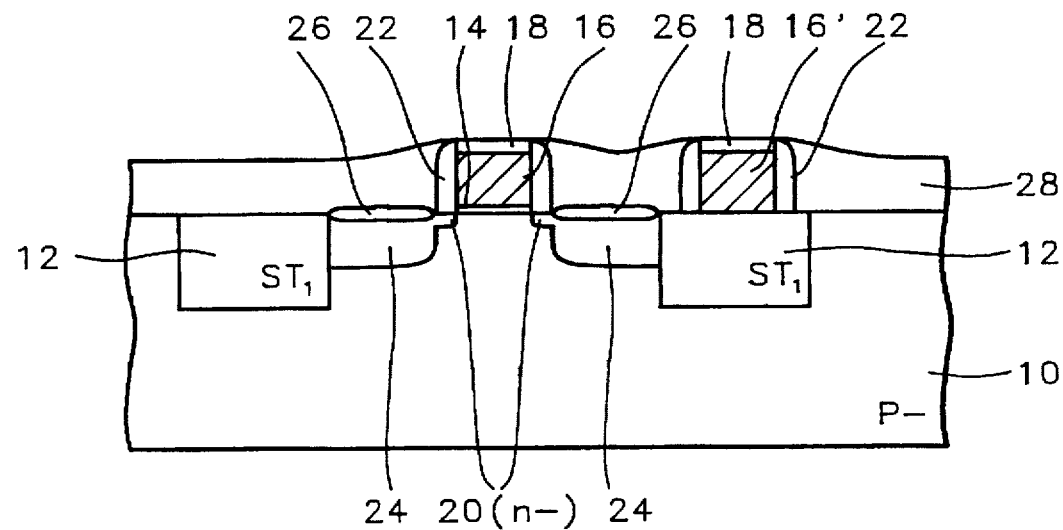

Referring to FIG. 4, second insulating layer 28 is chemical/mechanically polished (CMP) back to the $Si_3N_4$ capping layer 18 on the gate electrodes 16. The $Si_3N_4$ layer 18 serves as an endpoint detection for the CMP process. The CMP results in global planarization of the ILD layer 28.

Figure 5:
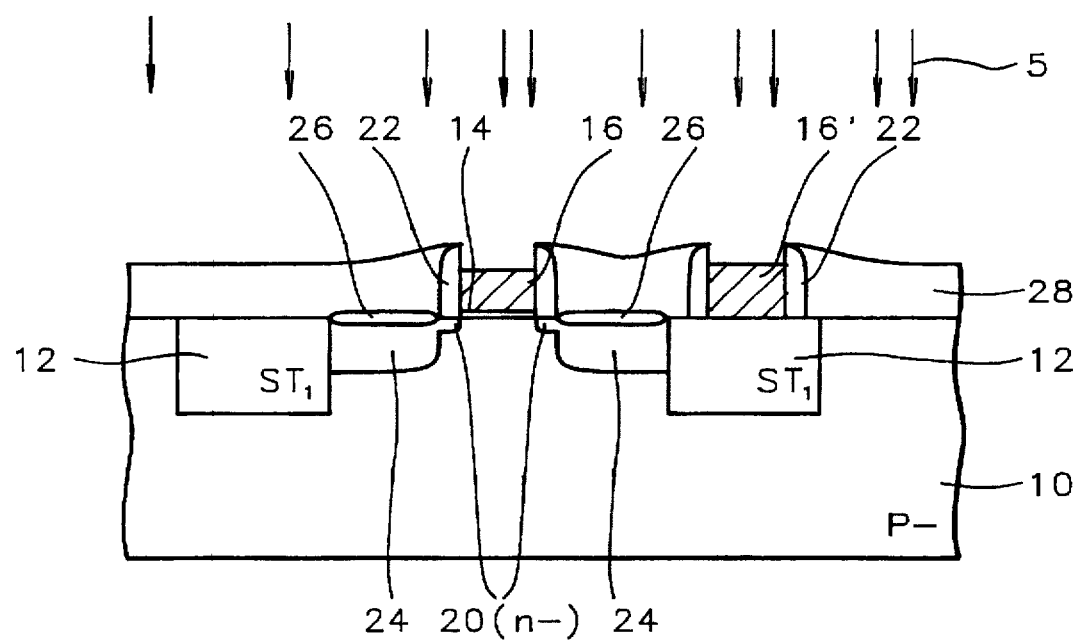

Referring now to FIG. 5, the silicon nitride layer 18 over the gate electrodes 16 is removed by wet etching in a hot phosphoric acid ($H_3PO_4$) exposing the $N^+$ polysilicon gate electrodes, and leaving unetched the self-aligned implant mask composed of the second insulating layer 28. A key feature of this invention is that the source/drain areas 24 are protected by the planar second insulating layer 28, which now serves as a self-aligned implant mask. The polysilicon gate electrodes 16 are now implanted with ions to amorphize the polycrystalline surface of the gate electrodes, as depicted in FIG. 5 by the downward arrows 5, while the implant mask 28 protects the source/drain areas 24 from ion implant damage. Preferably the ion implantation is carried out at low implant energy. For example, the implantation can be carried out using $As^{75}$ having an implant dose of between about 1.0 E 14 and 8.0 E 16 atoms/$cm^2$ and at an ion energy of between about 20 and 60 KeV.

Figure 6:
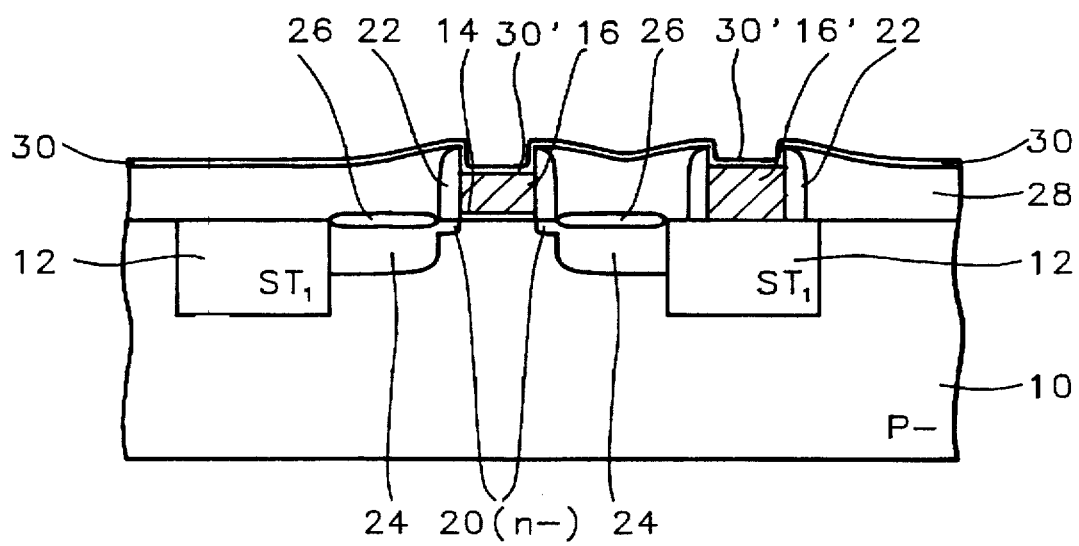

Referring to FIG. 6, a second titanium layer 30 is blanket deposited over the polysilicon gate electrodes 16 and elsewhere on the second insulating 28. Layer 30 is deposited using the same process as the deposition of the first Ti layer that was used for forming the $TiSi_2$ contacts 26 on the source/drain areas 24. Preferably the thickness of layer 30 is between about 200 and 480 Angstroms. Alternatively, layer 30 can be a multilayer that includes a top layer of titanium nitride (TiN) having a thickness between 100 and 400 Angstroms. The substrate is then annealed to form a titanium silicide layer 30' on the amorphized polysilicon surfaces of the gate electrodes 16, while Ti layer 30 on the second insulating layer 28 remains unreacted. Preferably the $TiSi_2$ is formed by a rapid thermal annealing (RTA) in a temperature range of between about 650° and 700° C. for about 20 to 40 seconds.

Figure 7:
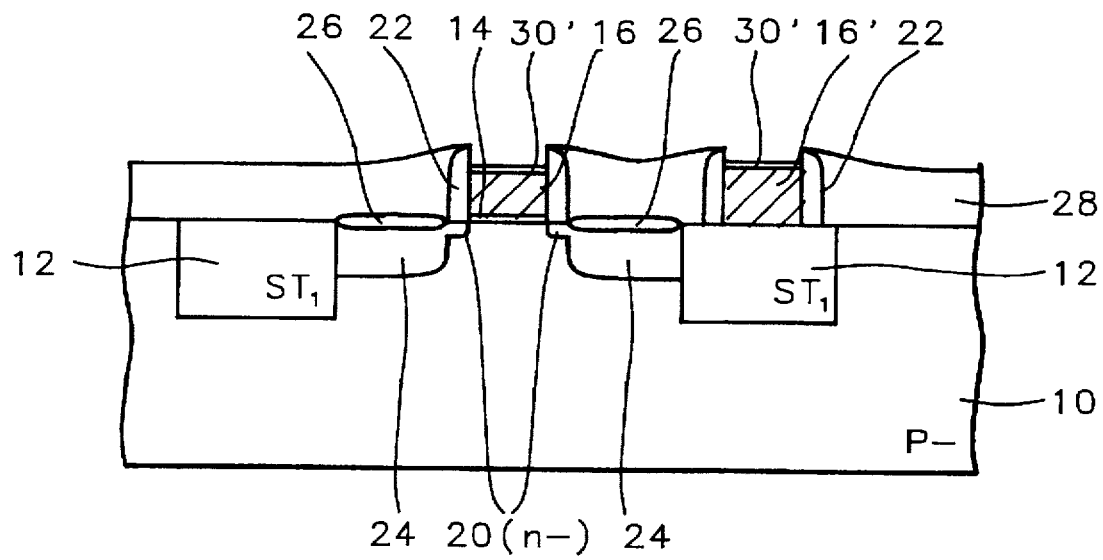

Referring to FIG. 7, the unreacted Ti and TiN are removed by wet etching in a hot phosphoric acid ($H_3PO_4$) solution. A second rapid thermal annealing is carried out to complete the $TiSi_2$ phase, and to further reduce the sheet resistance of the $TiSi_2$ 30' on the gate electrodes. Preferably the second anneal is carried out at a temperature between about 800° and 900° C. for between about 20 and 40 seconds. The low sheet resistance is also formed over the interconnecting lines 16'. The pre-amorphization and the silicide formation result in grain sizes less than the gate length. This provides gate electrodes with lower sheet resistance ($R_S$), for example, as low as about 2 ohms/square. This is approximately a 50% reduction in sheet resistance over the conventional process.

The self-aligned implant mask formed from the second insulating layer 28 not only protects the source/drain areas 24 from implant damage, but remains in the final integrated circuit structure to provide an essentially planar surface for further levels of metal interconnections.

Figure 8:
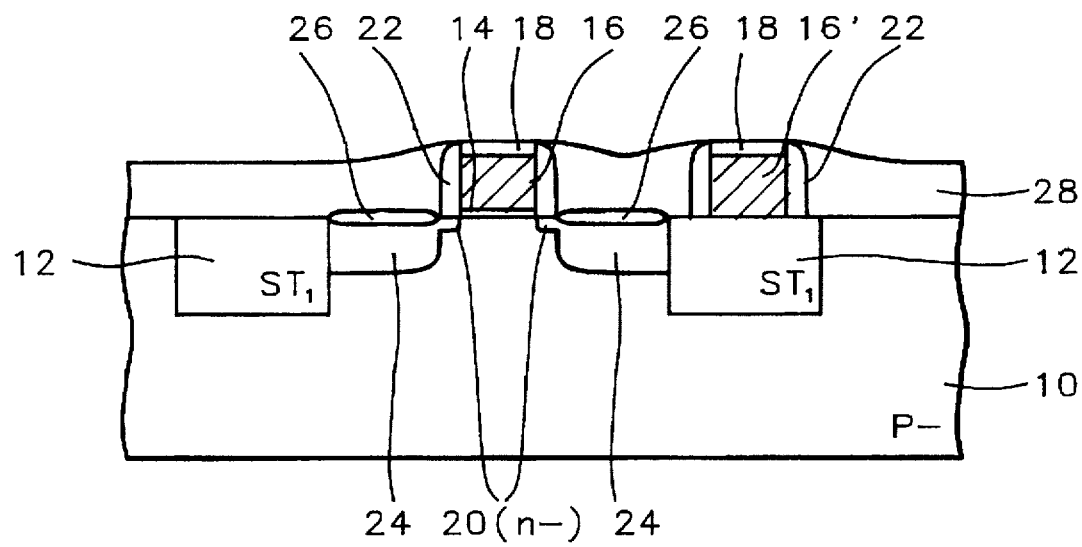
FIGS. 8 and 9 show cross-sectional views by a second embodiment for making a field effect transistor using cobalt silicide to reduce the FET gate electrode sheet resistance, and also using a self-aligned mask for forming silicide gates.
Figure 9:
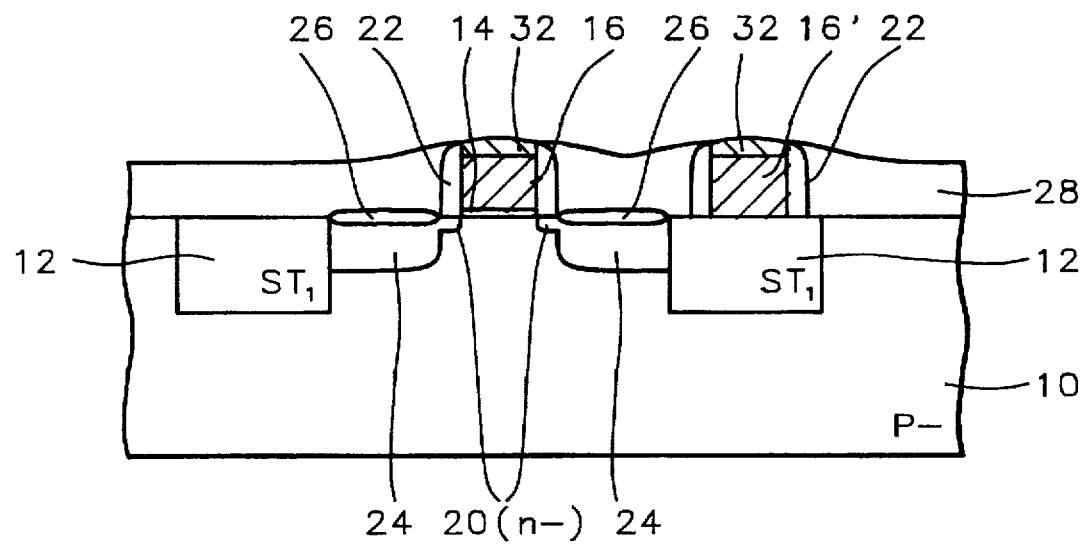

Referring to FIGS. 8-9, a second embodiment is now described for making the sub-quarter-micrometer (<0.25 um) gate electrodes also having a low sheet resistance ($R_S$). In this alternate process, the process steps are identical to the steps in the first embodiment up to and including the removal of the silicon nitride layer 18 from the gate electrodes 16, as shown in FIG. 4. Furthermore, the structure elements in the drawings are identically numbered, except for a cobalt silicide, which replaces the pre-amorphization implant and the second $TiSi_2$ of the first embodiment.

Referring to FIG. 8, $Si_3N_4$ layer 18 (as also depicted in FIG. 4) is removed by using a hot phosphoric acid etch, while essentially leaving unetched second insulating layer 28.

Now, as shown in FIG. 9, a self-aligned cobalt silicide layer 32 is formed over the polysilicon gate electrodes 16 and also over the polysilicon electrical interconnections 16'. The cobalt silicide is formed by depositing a cobalt layer (not shown in FIG. 9) having a thickness of between about 100 and 300 Angstroms. The cobalt layer is then annealed using a rapid thermal annealing (RTA) to provide low sheet resistance. Preferably the annealing is carried out in a temperature range of between about 650° and 725° C. for about 30 to 50 seconds. The unreacted cobalt is then removed in a solution of hydrochloric acid (HCl) and hydrogen peroxide ($H_2O_2$) at room temperature. The smaller grain sizes of the cobalt silicide provide a much lower sheet resistance than would otherwise be achieved with the more conventional titanium silicide process that does not use an amorphized implant. The self-aligning silicide mask formed from layer 28 prevents the cobalt from reacting with the source/drain contacts 24, and is also left in place during the completion of the integrated circuits to provide a more planar surface for additional levels of interconnections.

While the invention has been particularly shown and described with reference to the preferred embodiments thereof, it will be understood by those skilled in the art that various changes in form and details may be made without departing from the spirit and scope of the invention.

What is claimed is:

1. A method for fabricating field effect transistors (FETs) having low sheet resistance gate electrodes comprising the steps of:

providing a semiconductor substrate;

forming shallow trench isolation regions surrounding and electrically isolating device areas;

forming a gate oxide on said device areas by thermal oxidation;

depositing an $N^+$ conductively doped polysilicon layer on said substrate;

depositing a silicon nitride layer on said polysilicon layer;

patterning said silicon nitride layer and said polysilicon layer by photoresist masking and anisotropic etching leaving portions over said device areas to form said gate electrodes and to form electrical interconnections over said shallow trench isolation regions;

forming lightly doped source/drain areas adjacent to said gate electrodes by ion implantation;

depositing a conformal first insulating layer over said gate electrodes and elsewhere on said substrate;

anisotropically etching back said first insulating layer thereby forming sidewall spacers on said gate electrodes;

forming source/drain contact areas by ion implantation adjacent to said sidewall spacers;

depositing a blanket first titanium (Ti) layer and annealing said substrate to form titanium silicide on said source/drain contact areas while leaving unreacted titanium on insulated surfaces of said substrate;

stripping said unreacted first titanium from said substrate;

depositing a blanket second insulating layer on said substrate;

chemical/mechanically polishing said second insulating layer to said silicon nitride layer on said gate electrodes;

removing selectively said silicon nitride layer over said gate electrodes by wet etching while leaving said second insulating layer as a self-aligning implant mask;

implanting ions in said gate electrodes composed of said polysilicon layer thereby amorphizing the surface of said polysilicon layer, while masking said source/drain contact areas protected by said second insulating layer;

depositing a second titanium layer and annealing to form titanium silicide on said gate electrodes while leaving on said insulating layer unreacted portions of said second titanium layer;

stripping said unreacted second titanium on said second insulating layer, thereby completing said field effect transistors having said low sheet resistance.

2. The method of claim 1, wherein said $N^+$ doped polysilicon layer is doped with arsenic and has a dopant concentration of between about 1.2 E 20 and 2.8 E 20 atoms/$cm^3$.

3. The method of claim 1, wherein said polysilicon layer has a thickness of between about 1500 and 3000 Angstroms.

4. The method of claim 1, wherein said silicon nitride layer has a thickness of between about 1000 and 2000 Angstroms.

5. The method of claim 1, wherein said first titanium layer has a thickness of between about 200 and 450 Angstroms.

6. The method of claim 1, wherein said first titanium layer is annealed by rapid thermal annealing in a temperature range of between about 650° and 700° C. for a time of between about 20 and 40 seconds and then rapid thermal annealed in a temperature range of between about 800° and 900° C. for a time of between about 20 and 40 seconds.

7. The method of claim 1, wherein said second insulating layer has a thickness of between about 10000 and 15000 Angstroms.

8. The method of claim 1, wherein said amorphization of said polysilicon layer is achieved by implanting arsenic ($As^{75}$) ions having a dose of between about 1.0 E 14 and 8.0 E 14 ions/$cm^2$ and an implant energy of between about 20 and 60 KeV.

9. The method of claim 1, wherein said second titanium layer has a thickness of between about 200 and 450 Angstroms.

10. The method of claim 1, wherein said second titanium layer is annealed by rapid thermal annealing in a temperature range of between about 600° and 700° C. for a time of between about 20 and 40 seconds and then rapid thermal annealed in a temperature range of between about 800° and 900° C. for a time of between about 20 and 40 seconds.

11. A method for fabricating field effect transistors (FETs) having low sheet resistance gate electrodes comprising the steps of:

providing a semiconductor substrate;

forming shallow trench isolation regions surrounding and electrically isolating device areas;

forming a gate oxide on said device areas by thermal oxidation;

depositing an N⁺ conductively doped polysilicon layer on said substrate;

depositing a silicon nitride layer on said polysilicon layer;

patterning said silicon nitride layer and said polysilicon layer by photoresist masking and anisotropic etching leaving portions over said device areas to form said gate electrodes and to form electrical interconnections over said shallow trench isolation regions;

forming lightly doped source/drain areas adjacent to said gate electrodes by ion implantation;

depositing a conformal first insulating layer over said gate electrodes and elsewhere on said substrate;

anisotropically etching back said first insulating layer thereby forming sidewall spacers on said gate electrodes;

forming source/drain contact areas by ion implantation adjacent to said sidewall spacers;

depositing a blanket titanium (Ti) layer and annealing said substrate to form titanium silicide on said source/drain contact areas while leaving unreacted titanium on insulated surfaces of said substrate;

stripping said unreacted titanium from said substrate;

depositing a blanket second insulating layer on said substrate;

chemical/mechanically polishing said second insulating layer to said silicon nitride layer on said gate electrodes;

removing selectively said silicon nitride layer over said gate electrodes by wet etching while leaving said second insulating layer as a self-aligning implant mask;

depositing a cobalt layer on said gate electrodes and elsewhere on said second insulating layer;

annealing said cobalt layer to form cobalt silicide on said gate electrodes while leaving on said insulating layer unreacted portions of said cobalt layer;

stripping said unreacted cobalt layer on said second insulating layer, thereby completing said field effect transistors having said low sheet resistance.

12. The method of claim 11, wherein said N⁺ doped polysilicon layer is doped with arsenic and has a dopant concentration of between about 1.2 E 20 and 2.8 E 20 atoms/cm³.

13. The method of claim 11, wherein said polysilicon layer has a thickness of between about 1500 and 3000 Angstroms.

14. The method of claim 11, wherein said silicon nitride layer has a thickness of between about 1000 and 2000 Angstroms.

15. The method of claim 11, wherein said titanium layer has a thickness of between about 200 and 450 Angstroms.

16. The method of claim 11, wherein said titanium layer is annealed by rapid thermal annealing in a temperature range of between about 600° and 700° C. for a time of between about 20 and 40 seconds and then rapid thermal annealed in a temperature range of between about 800° and 900° C. for a time of between about 20 and 40 seconds.

17. The method of claim 11, wherein said second insulating layer has a thickness of between about 10000 and 15000 Angstroms.

18. The method of claim 11, wherein said cobalt layer has a thickness of between about 100 and 300 Angstroms.

19. The method of claim 11, wherein said cobalt layer is annealed by rapid thermal annealing in a temperature range of between about 650° and 725° C. for a time of between about 30 and 50 seconds.

* * * * *